(12) United States Patent
Kohno

(10) Patent No.: US 6,621,061 B2
(45) Date of Patent: Sep. 16, 2003

(54) EXPOSURE METHOD AND DEVICE MANUFACTURING METHOD USING THE SAME

(75) Inventor: Michio Kohno, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 300 days.

(21) Appl. No.: 09/820,617

(22) Filed: Mar. 30, 2001

(65) Prior Publication Data
US 2002/0005495 A1 Jan. 17, 2002

(30) Foreign Application Priority Data
Mar. 31, 2000 (JP) .................... 2000-096735

(51) Int. Cl.⁷ ................................ G01J 1/32
(52) U.S. Cl. ...................... 250/205; 250/548
(58) Field of Search ............. 250/205, 216, 250/548, 559.3, 201.3, 201.5, 306, 307; 356/399–401; 355/53, 55, 69

(56) References Cited

U.S. PATENT DOCUMENTS 6,002,467 A * 12/1999 Nishi et al. ............... 355/61

\* cited by examiner

Primary Examiner—Que T. Le
(74) Attorney, Agent, or Firm—Fitzpatrick, Cella, Harper & Scinto

(57) ABSTRACT

Disclosed is an exposure method, an exposure apparatus and a device manufacturing method, in which transmission factors of almost all optical systems, including a projection optical system, can be measured during an exposure process, and in which the exposure amount is controlled on the basis of it. The exposure apparatus includes an illumination optical system for illuminating a pattern of a reticle with a laser beam from an excimer laser, and a projection lens system for projecting the pattern illuminated by the illumination optical system onto a wafer, to thereby expose the wafer with the reticle pattern, wherein reflection light or ghost light produced at a surface of a lens of the projection lens system is received by a sensor and, on the basis of the an output of the sensor, the transmission factor of the projection lens system is measured. The exposure amount is then controlled on the basis of the measurement.

30 Claims, 6 Drawing Sheets

EXPOSURE METHOD AND DEVICE MANUFACTURING METHOD USING THE SAME

FIELD OF THE INVENTION AND RELATED ART

This invention relates to an exposure method, an exposure apparatus and/or a device manufacturing method. More particularly, the invention concerns a projection exposure method, a projection exposure apparatus and/or a device manufacturing method using the same, suitably usable in a lithographic process for manufacture of semiconductor devices, liquid crystal display devices or thin film magnetic heads, for example, for transferring a mask pattern to a substrate through a projection optical system.

For further improvements in integration and miniaturization of a semiconductor device, further increases of resolving power and transfer accuracy are required in exposure apparatuses which bear the lithography. In order to meet this requirement, exposure amount control for ensuring that a resist applied to a wafer (substrate) is exposed with a correct exposure amount should be carried out very precisely.

As regards light sources usable in photolithography, there are i-line (365 nm), KrF (248 nm), ArF (193 nm) and, in near future, $F_2$ (157 nm). As for exposure methods, there are a step-and-repeat method and a step-and-scan method.

In an example of exposure amount control method to be used with the step-and-repeat method, an exposure amount is measured between shot exposures by, using a sensor provided inside an illumination optical system. The thus obtained measured value is multiplied by a transmission factor of an optical system (a portion of an illumination system and a projection optical system) from the sensor to the wafer, to determine a predicted exposure amount on the wafer. On the basis of this, the exposure amount for a subsequent shot is adjusted by using a light quantity adjusting means, such as a laser output or ND filter, for example.

In an example to be used with the step-and-scan method, during scan of each shot, the exposure is made by plural light pulses. During this period, the output (light quantity) of a light source is continuously measured by use of a sensor inside an illumination optical system, and each pulse output is adjusted so that the integrated exposure amount in the shot reaches a predetermined level (corresponding to an optimum exposure amount determined by a resist). Also in this case, like the step-and-repeat method, the transmission factor of an optical system (a portion of an illumination system and a projection optical system) from the sensor to the wafer is estimated as a certain value, and the exposure amount on the wafer is predicted by multiplying the output by this estimated value.

These examples however involve the following inconveniences. That is, in these methods, the transmission factor of the optical system from the sensor inside the illumination system to the wafer (including a portion of the illumination system and the projection system) is assumed as a constant value. Alternatively, variation in transmission factor with respect to the exposure amount is measured beforehand, and the results are inputted. Anyway, such procedure has to correct the exposure amount while excluding a condition which cannot be disregarded in practice.

Practically, if the exposure wavelength becomes shorter than 200 nm, the absorption of light by an optical material (quartz, fluorite, optical coating, or the like) becomes large, and it applies a substantial influence to the precision of exposure amount control. For example, it has been found on the basis or data obtained by basic researches made to quartz that the laser projection causes both short-term degradation and long-term degradation, that the absorption is once lowered (recovery of transmission factor) in response to suspension of light irradiation, while, in response to restart of light irradiation, the absorption regresses to an original absorption curve (regression of absorption). Therefore, in exposure apparatuses, the transmission factor may vary very complicatedly in accordance with the exposure condition such as laser pulse energy, pulse number, reticle transmission factor, exposure suspension, or the like.

SUMMARY OF THE INVENTION

It is accordingly an object of the present invention to provide an exposure method, an exposure apparatus and/or a device manufacturing method, by which the transmission factor of an optical system, including a projection optical system, can be measured during an exposure process such that the exposure amount can be controlled very precisely.

In accordance with an aspect of the present invention, there is provided an exposure apparatus, comprising: an illumination optical system for illuminating a pattern with light from a light source; a projection optical system for projecting light from the pattern onto a substrate to be exposed, to thereby expose the substrate with the pattern; and measuring means for measuring, when exposure light contributable to the exposure of the substrate is being projected onto the substrate, a portion of the exposure light passing through at least a portion of said projection optical system but not reaching the substrate, to thereby detect a change in transmission factor of at least one of optical elements of said illumination optical system and said projection optical system.

In one preferred form of this aspect of the present invention, the exposure apparatus may further comprise control means for controlling the exposure amount on the basis of the measurement by said measuring means.

The at least one of the optical elements of said illumination optical system and said projection optical system may refer to at least one optical element of said illumination optical system and at least one optical element of said projection optical system.

The apparatus may further comprise storing means for storing an initial value of measurement, and comparing means for comparing a result of measurement made after the initial value is measured, and the initial value, wherein a change in transmission factor may be detected on the basis of the comparison.

The apparatus may further comprise control means for controlling the exposure amount on the basis of the detection of the change in transmission factor.

The projection optical system may include a refractive optical element, wherein the portion of the exposure light to be measured by said measuring means may be light reflected by a surface of the refractive optical element of said projection optical system.

The measurement of the portion of exposure light by said measuring means may be carried out by receiving light reflected by the surface of the refractive optical element with use of a first light receiving element which may be disposed one of inside said projection optical system, just below the mask, just above the mask, and inside said illumination optical system.

The first light receiving element may be placed in an optically conjugate relation with a slit aperture plane inside said illumination optical system.

The first light receiving element may be placed in a relation of a pupil plane with respect to a slit aperture plane inside said illumination optical system.

The surface of the refractive optical element may have a transmission factor made lower as compared with another refractive optical element of said projection optical system.

The refractive optical element may have an anti-reflection film formed on its surface, wherein an anti-reflection function of the anti-reflection film may be lowered as compared with another light transmitting surface.

The transmission factor of the surface of the refractive optical element may be lowered by applying a metal coating to the surface.

The surface of the refractive optical element may be disposed close, as much as possible, to the substrate.

The surface of the refractive optical element may be disposed at such position that light reflected by the surface of the refractive optical element is not excessively diverged or converged along a reflection light path.

A portion of the light reflected by the surface of the refractive optical element may be extracted outwardly of a path of the exposure light, by a reflection mirror disposed at a light path of said projection optical system.

The surface of the refractive optical element may be disposed at such position that the light reflected thereby is collected on the reflection mirror.

A portion of the light reflected by the surface of the refractive optical element may be extracted outwardly of a path of the exposure light, by a reflection mirror disposed at a light path of said illumination optical system.

A portion of the light reflected by the surface of the refractive optical element may be extracted outwardly of a path of the exposure light, on the basis of transmission of the same through a reflection mirror disposed at a light path of said illumination optical system.

The apparatus may further comprise storing means for storing an initial value of measurement, and comparing means for comparing a result of measurement made after the initial value is measured, and the initial value, wherein a change in transmission factor may be detected on the basis of the comparison.

The apparatus may further comprise control means for controlling the exposure amount on the basis of the detection of the change in transmission factor.

The apparatus may further comprise a second light receiving element for measuring a portion of illumination light emitted from said light source and directed through said illumination optical system toward the pattern.

The portion of the illumination light may be extracted on the basis of reflection of the same by a reflection mirror disposed inside said illumination optical system.

The portion of the illumination light may be extracted on the basis of transmission of the same through a reflection mirror disposed inside said illumination optical system.

The apparatus may further comprise a first light receiving element for receiving and measuring light reflected by the refractive optical element, and a second light receiving element for receiving and measuring a portion of illumination light emitted from said light source and directed through said illumination optical system toward the pattern, wherein a change in transmission factor may be detected on the basis of the results of measurements made by said first and second light receiving elements.

The apparatus may further comprise storing means for storing an initial value of measurement, and comparing means for comparing a result of measurement made after the initial value is measured, and the initial value, wherein a change in transmission factor is detected on the basis of the comparison.

An integrated exposure amount may be calculated on the basis of the detection of the change in transmission factor.

An exposure amount may be controlled on the basis of the detection of the change in transmission factor.

An exposure amount may be controlled on the basis of the detection of the change in transmission factor.

An integrated exposure amount may be calculated on the basis of detection of the change in transmission factor, and an exposure amount may be controlled on the basis of the calculation of the integrated exposure amount.

In accordance with another aspect of the present invention, there is provided a device manufacturing method, comprising the steps of: applying a resist to a surface of a substrate to be exposed; and exposing the substrate by use of an exposure apparatus as recited above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

In the preferred embodiments of the present invention to be described below, with the structure such as described above. the transmission factor of a projection optical system may be measured on the basis of reflection ghost light produced at a light path of the projection optical system. Then, based on a measured value obtained by the measurement, the light quantity adjustment of an illumination optical system may be carried out. More specifically, ghost reflection light at a certain refracting surface of a lens group, constituting the projection optical system, may be used. Such ghost light may be received by a photosensor which may be provided inside the illumination system. A photoelectric output from the sensor may be monitored continuously during the exposure process, and it may be fed back to the light source output or light quantity adjusting means inside the illumination system, by which the integrated exposure amount may be controlled. This enables that, not only variation in light quantity in an upstream portion of the illumination system (from a light source to an integrator) is monitored as conventionally, but also a change in transmission factor of a projection lens is measured in real time during the exposure process. As a result, the device exposure can be made stably at a constant exposure amount.

Further, the structure described above also enables precise detection of a change in optical material (optical thin film or glass material, for example) with respect to time. Therefore, even if the exposure condition for the device, such as reticle transmission factor, number of wafers per job, illumination condition, exposure duty or the like, differs complicatedly in dependence upon the process, the device exposure can be carried out constantly at a predetermined exposure amount. The yield of semiconductor device manufacture through the photolithography can be improved notably.

Preferred embodiments of the present invention will now be described with reference to the accompanying drawings.

Embodiment 1

Figure 1:
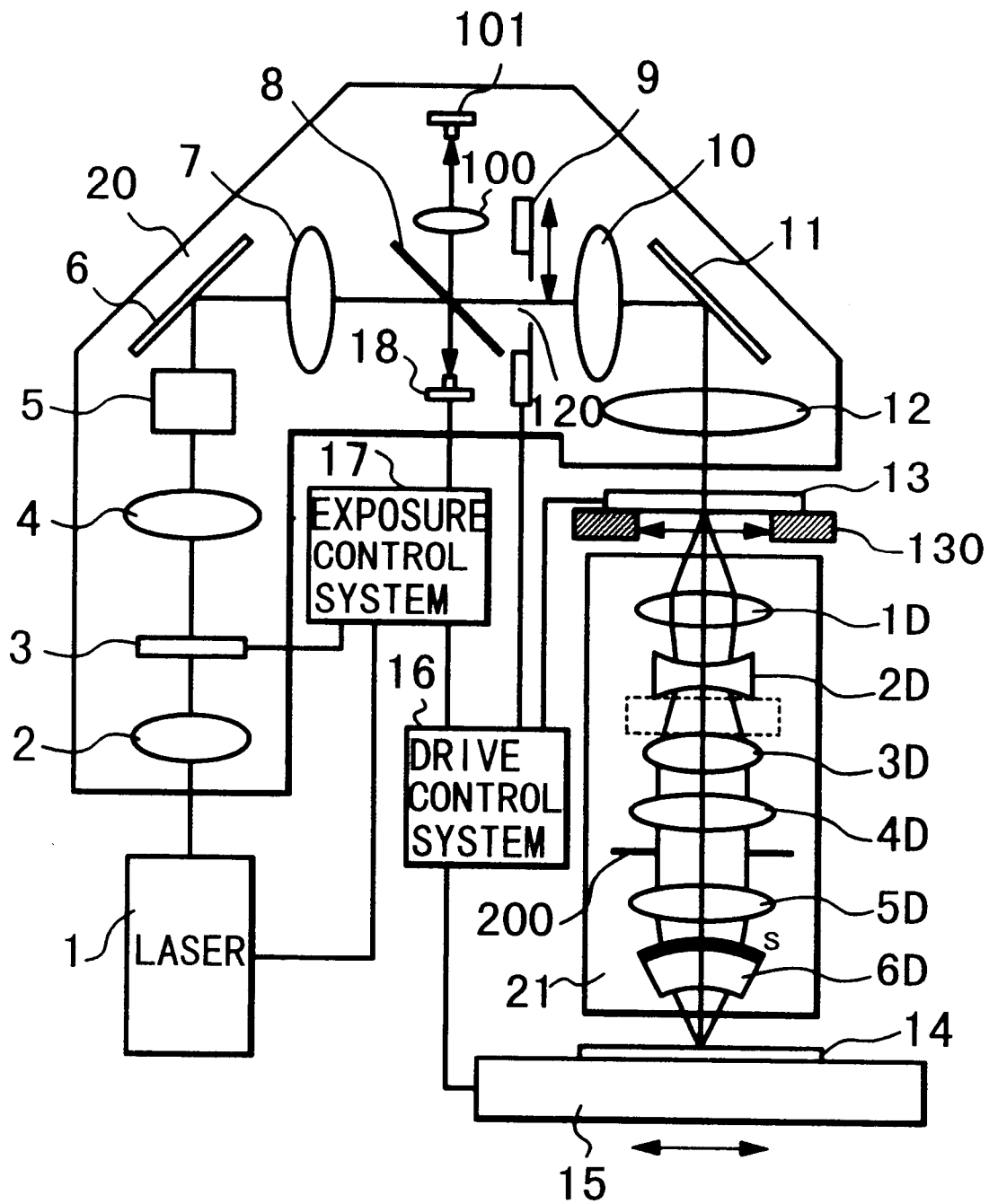
FIG. 1 is a schematic view of a general structure of an exposure apparatus according to a first embodiment of the present invention.

FIG. 1 shows the structure of an exposure apparatus according to a first embodiment of the present invention, and this is a scan type projection exposure apparatus for scanningly exposing shot regions on a wafer in accordance with a step-and-scan method. For manufacture of devices such as LST, for example, lithographic processes may be performed such that a wafer is exposed with a device pattern by use of this exposure apparatus, the exposed wafer is developed and etched. A parallel light beam (laser light) emitted from an $F_2$ laser which produces laser light to a wavelength 157 nm, has a sectional shape close to a linear shape. Thus, it is transformed by a beam shaping system 2 disposed at the entrance of an illumination system 20, into a circular sectional shape. To this end, generally, a cylindrical lens may be used, for example. The thus shaped parallel light beam enters a light quantity adjusting system 3 (ND filter or the like) by which the light energy is adjusted. The rate thereof is controlled by an exposure control system 17 on the basis of light information obtained by light quantity detecting means of the present invention, to be described later.

Subsequently, the parallel light beam goes through a condenser lens system 4 and illuminates an integrator 5 at a predetermined NA (numerical aperture). The integrator 5 is a light uniforming optical element as can be represented by a fly's eye lens (two-dimensional lens array). Through a first mirror 6 and a condenser lens system 2, it illuminates an aperture of a masking blade 9 uniformly. Here, there is a beam splitter 8 disposed between the condenser lens system 2 and the masking blade 9. It has a function for directing a portion of the light beam toward an Li sensor 18. The Li sensor 18 serves to continuously monitor the light energy amount coming thereto from the laser light source 1, and transmits a corresponding signal to the exposure control system 17. When the exposure control system 17 detects a change in light quantity from a predetermined reference quantity, it produces and applies, to the light quantity adjusting system 13 or to the laser 1, substantially in real time, a correction signal effective to maintain the exposure amount (laser light quantity) on the wafer constant.

Divergent light beam passing through the aperture of the masking blade 9 is collected on the surface of a reticle 13, by means of an imaging system 10, a second mirror 11 and a collimator 12.

Thereafter, the light goes through a projection lens 21 while being transmitted through its internal structural elements such as lens groups 1D, 2D, 3D and 4D, an aperture stop 200, and lens groups 5D and 6D, and finally, it is collected on a wafer 14 so that a reticle pattern image is formed thereon. The plane of the aperture of the masking blade 9 is placed in an optically conjugate relation with the reticle 13 surface and the wafer 14 surface. Where the step-and-scan method is used, a slit opening 120 for defining a rectangular exposure region (at 131 in FIG. 6) upon the reticle surface is provided there. Two blades (light blocking plates) for defining this opening are reciprocally moved in the scan direction in synchronism with the scan of a reticle stage 130 and a wafer stage 15, as depicted by an arrow in FIG. 1. Each lens shown in FIG. 1 is made of fluorite or a material having a transmission factor equivalent to it. A diffractive optical element may be used, as required.

An important feature of this embodiment resides in the provision of means for continuously measuring the transmission factor of the projection lens 21, to be described below. Namely, a particular note is paid to a certain transmission surface (lens surface) of lens groups constituting the projection lens, and reflection light (ghost light) is produced intentionally from that surface. More specifically, in FIG. 1, the anti-reflection effect of an anti-reflection film formed at an upper surface S of the final lens 6D, which is closest to the image side, is lowered to increase the reflection factor of it. The thus produced ghost light goes back through the projection lens 21 and passes through the reticle aperture. Further, it goes back through the illumination system 20, and passes the slit opening 120. Then, the ghost light is reflected by the beam splitter 8 and, with the function of a condensing optical system 100, it is collected on a transmission factor sensor 101. In the structure described above, the sensor 101 may be placed in an optically conjugate relation with the slit aperture plane 120, or it may be placed in a relation of a pupil plane with the slit aperture plane 120. In the former case, there is an inconvenience that the light shifts on the sensor light receiving surface with the motion of the masking blade, whereas, in the latter case, the light does not shift on the sensor light receiving surface. Either of them may be selected, for optimization of the system, on the basis of calculation of the light quantity to be received, for example. The optical relationship between the surface S (ghost producing surface) and the sensor 101 may be a conjugate relation or a relation of an image and a pupil or, alternatively, any other relation.

The projection lens 21 is an optical system of dioptric type. However, a catadioptric system may be used.

In the drawing, a drive control system 16 has a function for controlling the synchronism, during the exposure process, of all the driving units such as masking blade 9, reticle stage 130, and wafer stage 15. While being controlled thereby, the exposure control system 17 controls the exposure amount. The function thereof will be described below.

Figure 5:
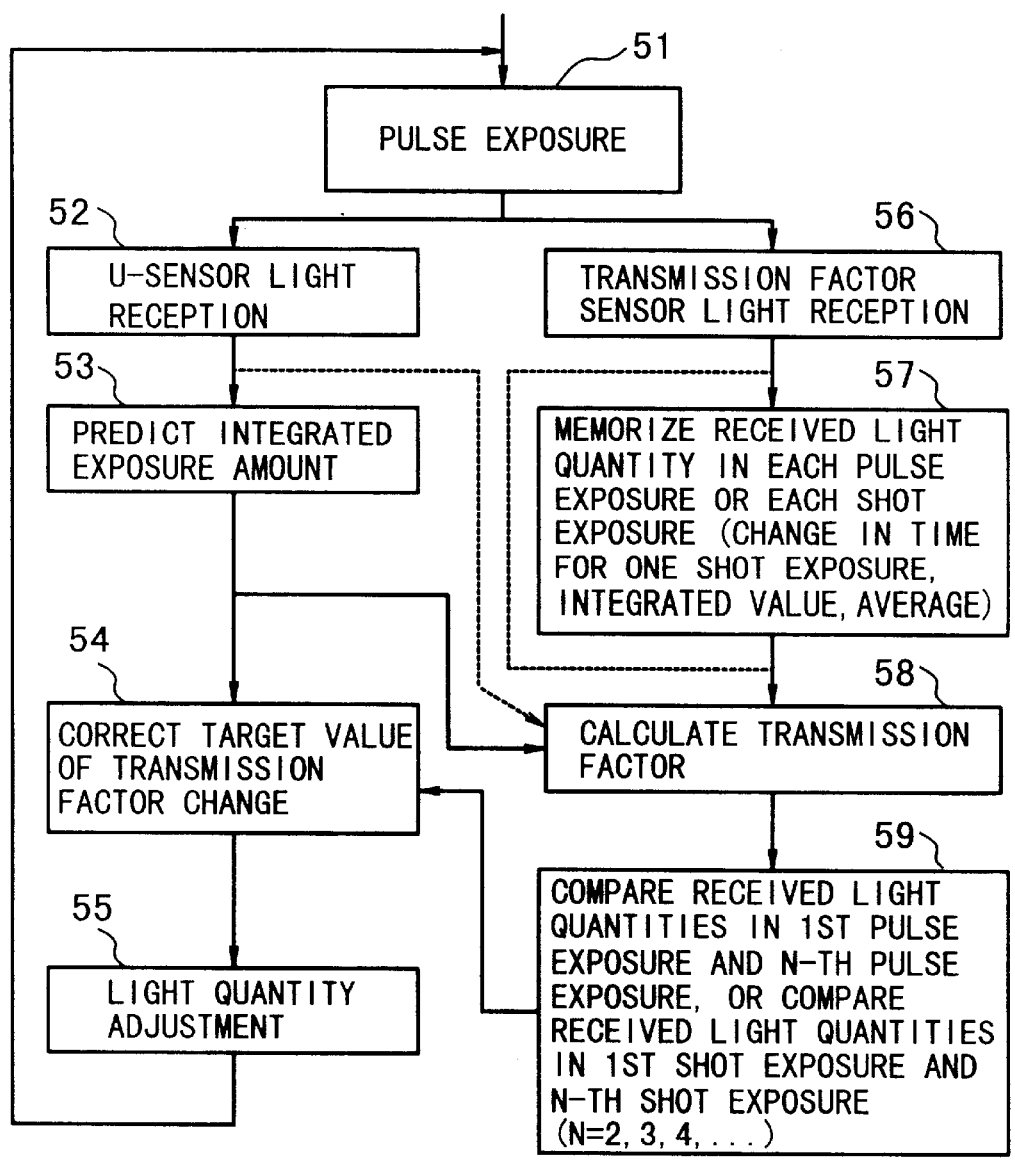
FIG. 5 is a flow chart for explaining a sequence for correcting transmission factor variation of a projection system, in the first embodiment of the present invention.

FIG. 5 shows an example of an integration exposure amount control sequence of the exposure control system 17.

As a first stage shown in the left-hand side flow of FIG. 5, as the laser light source emits pulse light, the Li sensor receives the light quantity. In order that a final integrated exposure amount in one shot is registered with a predetermined target value as determined by the resist sensitivity, the exposure control system 17 is going to perform the light quantity adjustment to adjust, with respect to a current pulse energy, the pulse energy to be emitted subsequently. Here, the transmission factor measuring means of the present invention operates.

As a second stage shown in the right-hand side flow of FIG. 5, the emitted pulse light is received as flare light also by the sensor 101. In response to the pulse light quantity as detected by the sensor 101, the exposure control system 17 stores an integrated exposure amount or an average pulse light quantity in one shot that can be predicted from the detected pulse light quantity, or a change in time of each pulse light quantity during one shot exposure, for example. Then, this value is compared with the Li sensor output value as determined by the same definition. Alternatively, for each pulse, the outputs of both the sensors may be compared with each other (as depicted by broken lines in the drawing). The comparison value here may be a ratio of outputs, such as a ratio of "transmission sensor output" divided by "Li sensor output", for example.

The comparison value corresponds to the transmission factor of an optical system following the Li sensor, such as the masking imaging system, the collimator and the projection system, and it is free from the influence of a change of an optical system before the Li sensor. The transmission factor may be stored in relation to each shot or each light pulse. For example, comparison values may be compared with each other between a first shot (pulse) and a shot (pulse) after it. This enables real time measurement of any change in transmission factor of the optical system after the Li sensor. On the basis of the thus detected change in transmission factor, the predicted value of the integrated exposure amount based on the Li sensor only may be corrected, and the light quantity adjustment may be carried out. This assures that a constant exposure energy is supplied continuously to the wafer.

Figure 6:
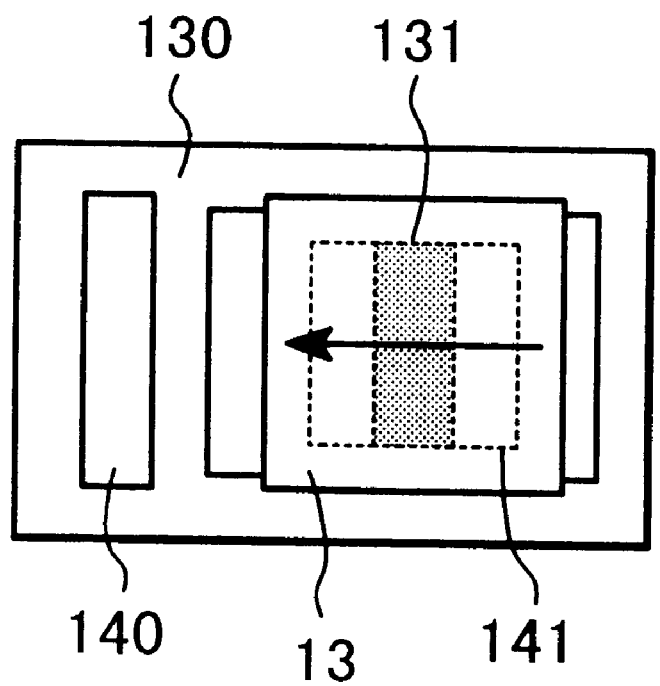
FIG. 6 is a plan view schematically showing a layout structure related to a reticle stage, in the first embodiment of the present invention.
Figure 7:
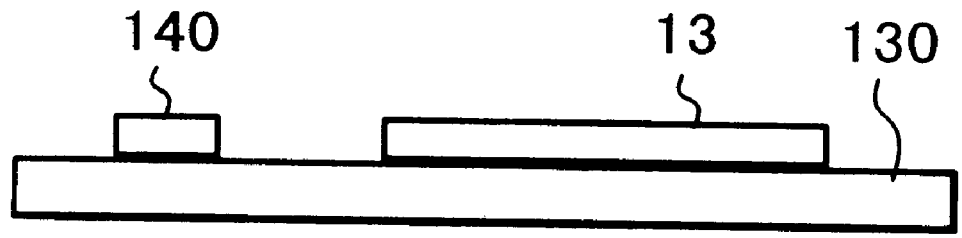
FIG. 7 is a side view schematically showing a layout structure related to a reticle stage, in the first embodiment of the present invention.

FIG. 6 is a plan view of a layout structure related to the reticle stage, and FIG. 7 is a side view thereof.

In the structure of this embodiment, the ghost reflection light produced at the surface S of the lens 6D goes back along the exposure light path inside the projection lens 21, and it passes through the reticle. The extension of light upon the reticle is determined by the reflection condition of exposure light at the surface S. Generally, it has a shape of blurred (swelled) slit-like region such as depicted by a hatching 131 in FIG. 6.

In an actual device region 141 of a reticle (FIG. 6), there are various circuit patterns formed. It means that this region 141 contains a portion (white portion) being transmissive to exposure light and a portion (black portion) defined by a light blocking chromium material.

Thus, the light to be received by the transmission factor sensor 101 is the light having been influenced, in quantity thereof, by the reticle as the same passes the reticle twice (forward and returning paths), in accordance with the reticle transmission factor. The reticle transmission factor may be considered as being equal to "the total white-portion area inside the rectangular illumination region" as divided by "the area of rectangular illumination region".

Figure 4:
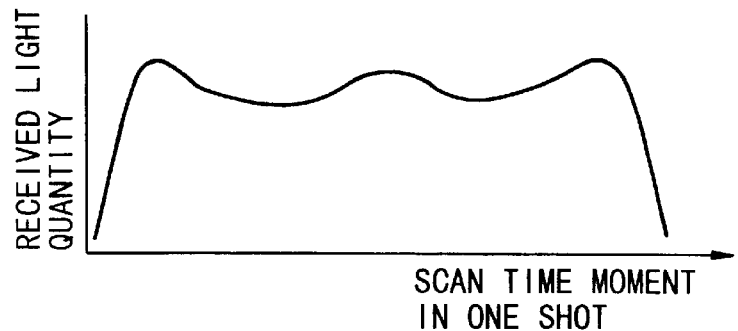
FIG. 4 is a graph for explaining changes in transmission factor of a reticle during a scan exposure, in the first embodiment of the present invention.

FIG. 4 illustrates an example in which the received light quantity of the transmission factor sensor 101 changes during the scan exposure of one shot. The axis of abscissa denotes time, and the axis of ordinate denotes the received light quantity, and it corresponds to the reticle transmission factor. Namely, even for the first shot exposure, during the scan, the ratio between the white portion and the black portion in the illumination region changes every moment. Thus, there occurs a light quantity variation (light quantity pattern) such as shown in FIG. 4. In the present invention, during a first shot scan, for example, such variation is read and stored as an offset for the received light quantity of the sensor 101, in relation to every moment. This is carried out by the exposure control system.

In this embodiment, a change in transmission factor of the exposure system as the exposure load to an optical system is enlarged with the repetition of exposures, is measured. Therefore, even it the initial transmission factor differs with each reticle, once the initial light quantity pattern corresponding to the reticle transmission factor distribution is measured and stored first, any change in transmission factor of the exposure system during the progress of exposure can be detected by comparing it with the stored data.

As regards the measurement of initial light quantity pattern shown in FIG. 4, it may be done in relation to a first shot in the actual exposure process. Alternatively, prior to it, a "dummy scan" for measurement of the light quantity pattern may be carried out by using an actual reticle.

Selection of a lens system in the projection lens system 21 for defining the surface S where ghost light is to be produced for detection of a change in the transmission factor of the optical system, may be determined in accordance with what is required. In other words, the reflection surface S may be selected so that the measurement light passes a largest number of optical elements along the light path from the Li sensor to the wafer 14. To this end, preferably, the reflection surface S should be set at the surface, among the projection lens system 21, which is closest to the wafer 14. It is an additional condition for selection of the surface S is that it should not cause excessive diffusion of ghost light. This is to prevent that the light to be received is eclipsed by a barrel, for example, to cause a decrease of the received light quantity.

Further, if, in the returning path, the light is too collected on the reticle 13, it is directly influenced by the presence of the transmissive area and the light blocking area in the reticle pattern. Namely, the quantity of light passing through the reticle excessively changes during the scan, beyond the linearity range of the sensor sensitivity, and the measurement precision is lowered. In order to avoid this, as an example, the ghost reflection light may be caused to be reflected approximately perpendicularly (in the direction of a normal) to the reflection surface so that it goes back along its on-coming (forward) path. If this condition is satisfied, the reflection light is re-imaged on the reticle, such that, the light as a while passes the reticle 13 while defining the same rectangular region as that in the forward path.

In order to satisfy these conditions that the ghost producing surface is close to the wafer 14, that the ghost is not excessively diffused, and that it is not excessively collected on the reticle 13, in this embodiment, the surface S is selected. This surface can be present commonly in practical projection lens systems. For, in super-resolution lenses having an NA of 0.6 or more, the lens system has such structure that, in order to suppress aberrations, a lens close to an image plane (or a wafer 14) is arranged to satisfy a concentric condition (imaging light rays are incident along a normal to the refractive surface)

Embodiment 2

Figure 2:
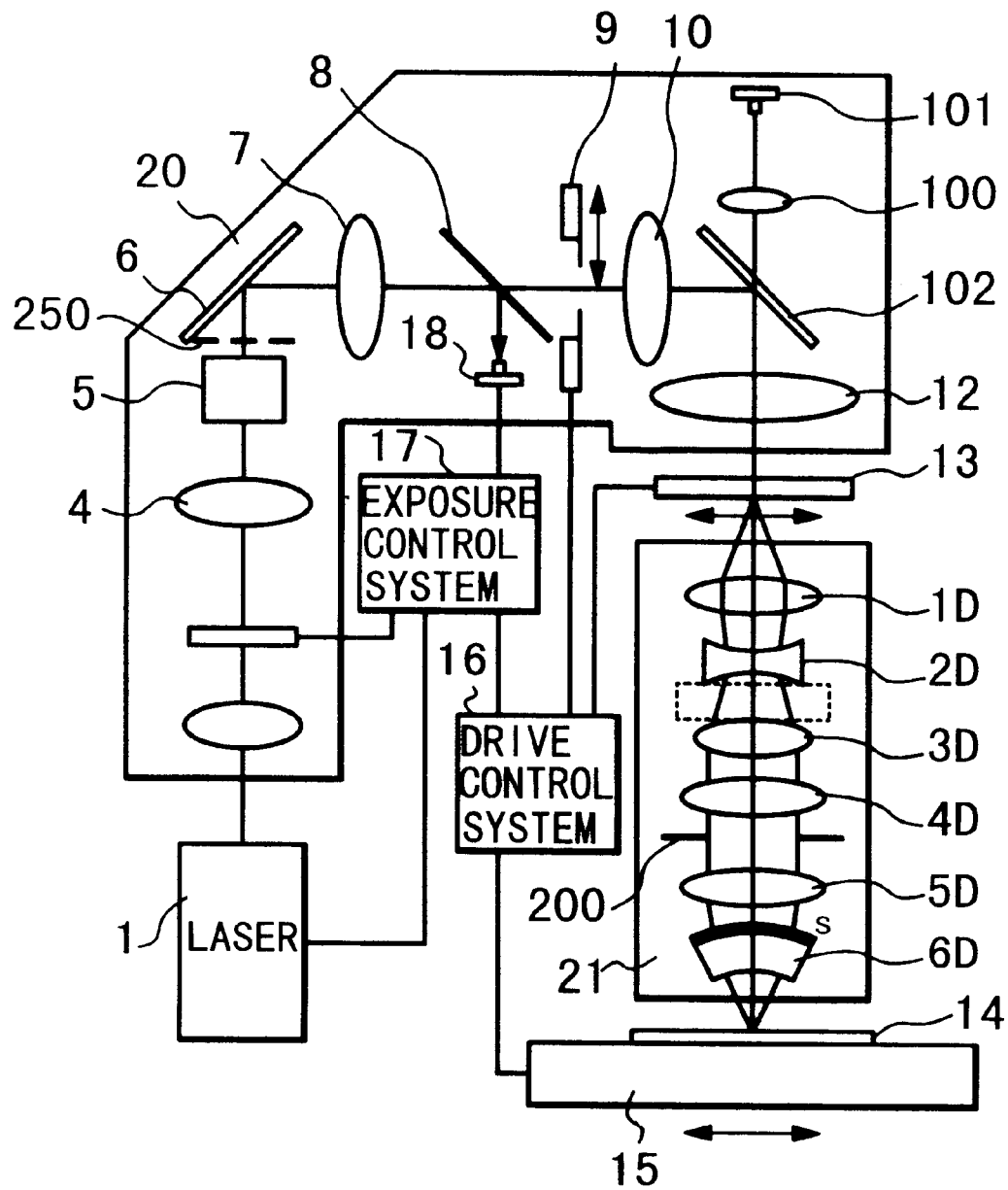
FIG. 2 is a schematic view of a general structure of an exposure apparatus according to a second embodiment of the present invention.
Figure 8:
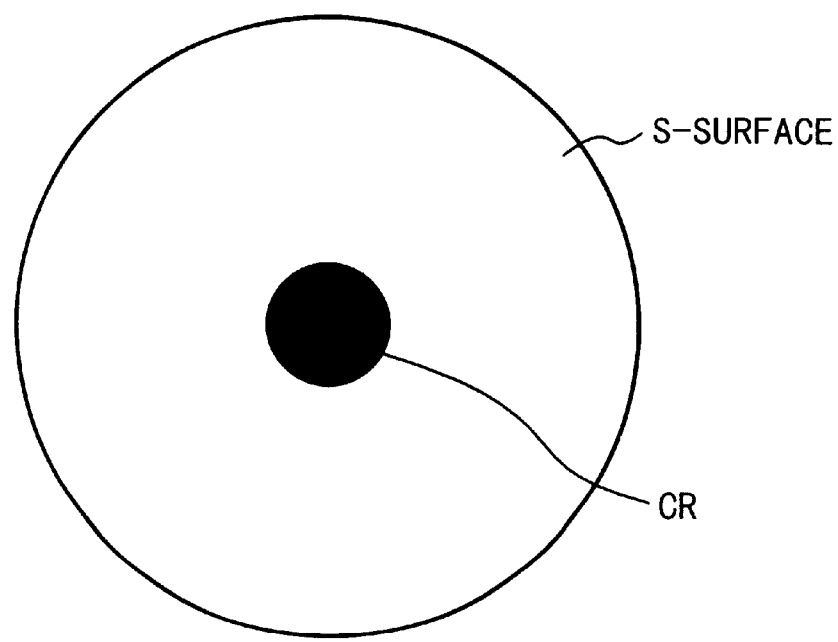
FIG. 8 is a sectional view of a ghost producing surface (surface S) in a second embodiment of the present invention.

FIG. 2 is a schematic view of a general structure of an exposure apparatus according to a second embodiment of the present invention. The exposure apparatus of FIG. 2 has a basic structure which is similar to that of the FIG. 1 embodiment. It differs from the FIG. 1 embodiment in that the light receiving optical system 100 and the transmission factor sensor 101 are provided just above the collimator lens system 12 inside the illumination system. In order to accomplish this, the first mirror 2 is replaced by a half mirror 102, to direct the ghost light produced at the surface S of the lens 6D to the sensor 101. The optical relationship between the surface S (ghost producing surface) and the sensor 101 may be either a conjugate relation or a relation of an image and a pupil. Here, as a measure for increasing the quantity of light to be received, as shown in FIG. 8, for example, a metal coating may be applied to a portion of the ghost producing surface (surface S), to thereby improve the reflectivity. In this example, a central portion CR is coated. This surface and the sensor surface 101 may be placed in a conjugate relation. By disposing the sensor 101 at the position where the reflectivity enhanced portion CR is imaged, the quantity of received light increases largely.

Figure 9:
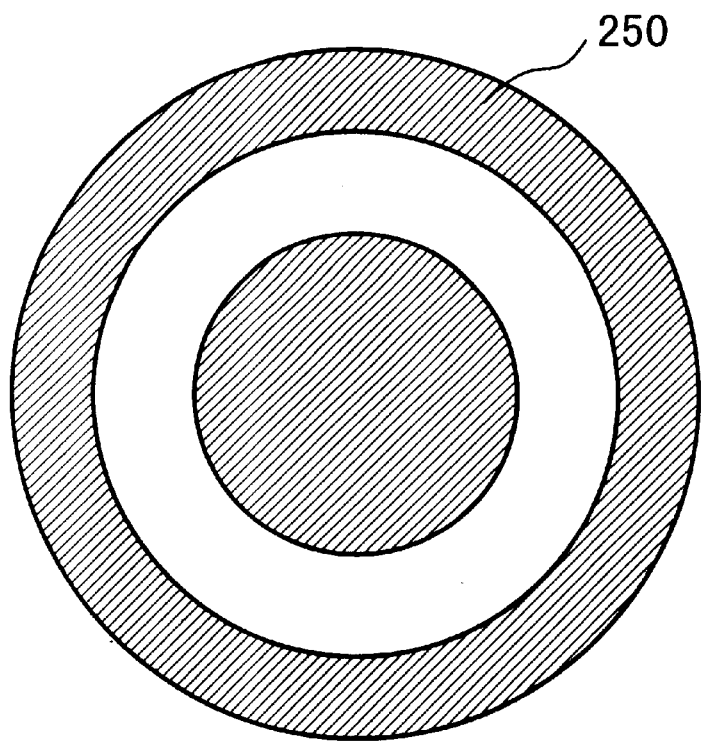
FIG. 9 is a schematic view for explaining a light quantity distribution (ring-like illumination) at an exit of a stop inside an illumination system, in the second embodiment of the present invention.

FIG. 9 illustrates a stop 250 for modified or deformed illumination (ring-like illumination) which is provided at an exit of the integrator 5 in FIG. 2. The white portion in the drawing depicts a region through which the exposure light passes. This type of stop is commercially available and it can be used for extending the limit resolution in fine pattern production. In this embodiment, the stop 250 of the illumination system may be made interchangeable between standard illumination and modified illumination, although the mechanism therefor is not illustrated. For standard illumination, a stop having a circular aperture at its center is used.

If a metal coating CR such as shown in FIG. 8 is used under the illumination condition which uses the stop of FIG. 9, the exposure energy on the surface S of the lens 6D is concentrated to zero-th order light at the hatched portion in FIG. 9. Therefore, advantageously, except for the pattern diffracted light directed to the portion CR, the exposure light quantity (illuminance) to be used does not decrease.

Embodiment 3

Figure 3:
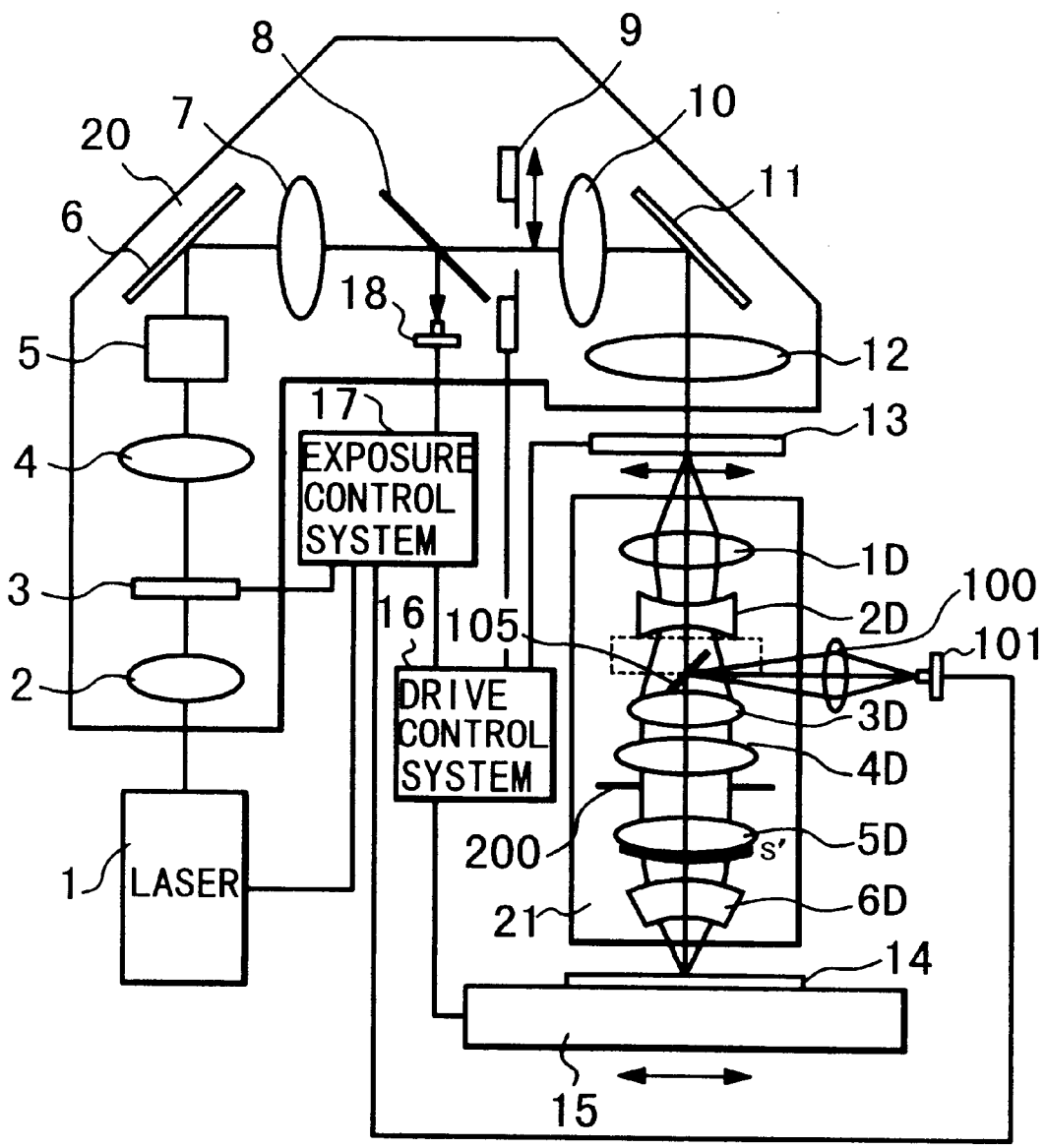
FIG. 3 is a schematic view of a general structure of an exposure apparatus according to a third embodiment of the present invention.

FIG. 3 is a schematic view of a general structure of an exposure apparatus according to a third embodiment of the present invention. This embodiment has a basic structure similar to that of the FIG. 1 embodiment. It differs from the FIG. 1 embodiment in that a small third mirror 105 (it may be a half mirror) is provided at the light path of the projection lens 21, to extract a portion of the ghost light produced by the surface S of the lens 5D, outwardly of the exposure light path, and to direct the same to the light receiving optical system 100 and the transmission factor sensor 101. The third embodiment has an advantage that, since the ghost light does not pass the reticle, the loss of the light quantity thereby is prevented. In this embodiment, the surface for producing the ghost light is not limited to a surface which satisfies the above-described conditions. In this example, a lens surface S' being convexed toward the wafer 14 is selected such that the ghost light can be collected on the mirror 3, and the transmission factor of that surface is lowered (to increase the reflectivity). With this arrangement, the ghost light can be directed to the sensor 101 without leakage.

The embodiments described above concern a scan type projection exposure apparatus (step-and-scan type) However, the invention is not limited to it. Namely, the present invention is applicable to a step-and-repeat type exposure apparatus (stepper), and also to an i-line scanner in which the exposure load is large. A basic structure and sequence for transmission factor measurement and correction are essentially the same. In an i-line scanner, as compared with a scanner using $F_2$ excimer laser, KrF excimer laser or ArF excimer laser, degradation of a glass material or an optical thin film less occurs. On the other hand, an organic gas or a siloxanes series gas contained in the exposure environment may be adhered to a lens surface to cause a decrease of the transmission factor. The present invention is effective to such problem.

In accordance with the embodiments of the present invention as described hereinbefore, the transmission factor of an optical system including a projection optical system is measured during the exposure process, and the exposure amount is controlled very precisely.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
   an illumination optical system for illuminating a pattern with light from a light source;
   a projection optical system for projecting light from the pattern onto a substrate to be exposed, to thereby expose the substrate with the pattern; and
   measuring means for measuring, when exposure light contributable to the exposure of the substrate is being projected onto the substrate, a portion of the exposure light passing through at least a portion of said projection optical system but not reaching the substrate, to thereby detect a change in transmission factor of at least one of optical elements of said illumination optical system and said projection optical system.

2. An apparatus according to claim 1, further comprising control means for controlling the exposure amount on the basis of the measurement by said measuring means.

3. An apparatus according to claim 1, wherein said at least one of the optical elements of said illumination optical system and said projection optical system refers to at least one optical element of said illumination optical system and at least one optical element of said projection optical system.

4. All apparatus according to claim 1, further comprising storing means for storing an initial value of measurement, and comparing means for comparing a result of measurement made after the initial value is measured, and the initial value, wherein a change in transmission factor is detected on the basis of the comparison.

5. An apparatus according to claim 4, further comprising control means for controlling the exposure amount on the basis of the detection of the change in transmission factor.

6. An apparatus according to claim 1, wherein said projection optical system includes a refractive optical element, and wherein the portion of the exposure light to be measured by said measuring means is light reflected by a surface of the refractive optical element of said projection optical system.

7. An apparatus according to claim 6, wherein the measurement of the portion of exposure light by said measuring means is carried out by receiving light reflected by the surface of the refractive optical element with use of a first light receiving element which is disposed one of inside said projection optical system, just below the mask, just above the mask, and inside said illumination optical system.

8. An apparatus according to claim 7, wherein said first light receiving element is placed in an optically conjugate relation with a slit aperture plane inside said illumination optical system.

9. An apparatus according to claim 7, wherein said first light receiving element is placed in a relation of a pupil plane with respect to a slit aperture plane inside said illumination optical system.

10. An apparatus according to claim 6, wherein the surface of the refractive optical element has a transmission factor made lower as compared with another refractive optical element of said projection optical system.

11. An apparatus according to claim 10, wherein the refractive optical element has an anti-reflection film formed on its surface, and wherein an anti-reflection function of the anti-reflection film is lowered as compared with another light transmitting surface.

12. An apparatus according to claim 10, wherein the transmission factor of the surface of the refractive optical element is lowered by applying a metal coating to the surface.

13. An apparatus according to claim 6, wherein the surface of the refractive optical element is disposed close, as much as possible, to the substrate.

14. An apparatus according to claim 6, wherein the surface of the refractive optical element is disposed at such position that light reflected by the surface of the refractive optical element is not excessively diverged or converged along a reflection light path.

15. An apparatus according to claim 6, wherein a portion of the light reflected by the surface of the refractive optical element is extracted outwardly of a path of the exposure light, by a reflection mirror disposed at a light path of said projection optical system.

16. An apparatus according to claim 15, wherein the surface of the refractive optical element is disposed at such position that the light reflected thereby is collected on the reflection mirror.

17. An apparatus according to claim 6, wherein a portion of the light reflected by the surface of the refractive optical element is extracted outwardly of a path of the exposure light, by a reflection mirror disposed at a light path of said illumination optical system.

18. An apparatus according to claim 6, wherein a portion of the light reflected by the surface of the refractive optical element is extracted outwardly of a path of the exposure light, on the basis of transmission of the same through a reflection mirror disposed at a light path of said illumination optical system.

19. An apparatus according to claim 6 further comprising storing means for storing an initial value of measurement, and comparing means for comparing a result of measurement made after the initial value is measured, and the initial value, wherein a change in transmission factor is detected on the basis of the comparison.

20. An apparatus according to claim 19, further comprising control means for controlling the exposure amount on the basis of the detection of the change in transmission factor.

21. An apparatus according to claim 1, further comprising a second light receiving element for measuring a portion of illumination light emitted from said light source and directed through said illumination optical system toward the pattern.

22. An apparatus according to claim 21, wherein the portion of the illumination light is extracted on the basis of reflection of the same by a reflection mirror disposed inside said illumination optical system.

23. An apparatus according to claim 21, wherein the portion of the illumination light is extracted on the basis of transmission of the same through a reflection mirror disposed inside said illumination optical system.

24. An apparatus according to claim 6, further comprising a first light receiving element for receiving and measuring light reflected by the refractive optical element, and a second light receiving element for receiving and measuring a portion of illumination light emitted from said light source and directed through said illumination optical system toward the pattern, wherein a change in transmission factor is detected on the basis of the results of measurements made by said first and second light receiving elements.

25. An apparatus according to claim 24, further comprising storing means for storing an initial value of measurement, and comparing means for comparing a result of measurement made after the initial value is measured, and the initial value, wherein a change in transmission factor is detected on the basis of the comparison.

26. An apparatus according to claim 24, wherein an integrated exposure amount is calculated on the basis of the detection of the change in transmission factor.

27. An apparatus according to claim 24, wherein an exposure amount is controlled on the basis of the detection of the change in transmission factor.

28. An apparatus according to claim 25, wherein an exposure amount is controlled on the basis of the detection of the change in transmission factor.

29. An apparatus according to claim 25, wherein an integrated exposure amount is calculated on the basis of detection of the change in transmission factor, and wherein an exposure amount is controlled on the basis of the calculation of the integrated exposure amount.

30. A device manufacturing method, comprising the steps of:

applying a resist to a surface of a substrate to be exposed; and exposing the substrate by use of an exposure apparatus as recited in claim 1.

* * * * *

UNITED STATES PATENT AND TRADEMARK OFFICE
CERTIFICATE OF CORRECTION

PATENT NO. : 6,621,061 B2
DATED : September 16, 2003
INVENTOR(S) : Michio Kohno

It is certified that error appears in the above-identified patent and that said Letters Patent is hereby corrected as shown below:

<u>Title page,</u>
Item [57], ABSTRACT,
Line 13, the first occurrence of "the" should be deleted.

<u>Column 4,</u>
Line 63, "above." should read -- above, --.

<u>Column 8,</u>
Line 13, "it" should read -- if --.

<u>Column 11,</u>
Line 50, "claim 6" should read -- claim 6, --.

Signed and Sealed this

Twenty-fourth Day of February, 2004

JON W. DUDAS
*Acting Director of the United States Patent and Trademark Office*